United States Patent
Gera et al.

(10) Patent No.: US 11,310,913 B2
(45) Date of Patent: Apr. 19, 2022

(54) SEMICONDUCTOR COMPONENT, AND CONTACTING ASSEMBLY HAVING A SEMICONDUCTOR COMPONENT AND A PRINTED CIRCUIT BOARD

(71) Applicant: Robert Bosch GmbH, Stuttgart (DE)

(72) Inventors: Guenter Gera, Leonberg (DE); Klaus Kosbi, Reutlingen (DE); Lars Vollmer, Stuttgart-Vaihingen (DE); Matthias Lausmann, Murr (DE)

(73) Assignee: Robert Bosch GmbH, Stuttgart (DE)

( * ) Notice: Subject to any disclaimer, the term of this patent is extended or adjusted under 35 U.S.C. 154(b) by 308 days.

(21) Appl. No.: 16/642,960

(22) PCT Filed: Aug. 3, 2018

(86) PCT No.: PCT/EP2018/071190
§ 371 (c)(1),
(2) Date: Feb. 28, 2020

(87) PCT Pub. No.: WO2019/042709
PCT Pub. Date: Mar. 7, 2019

(65) Prior Publication Data
US 2020/0196449 A1 Jun. 18, 2020

(30) Foreign Application Priority Data
Aug. 28, 2017 (DE) ...................... 10 2017 215 027.0

(51) Int. Cl.
*H05K 1/14* (2006.01)
*H05K 1/11* (2006.01)
(Continued)

(52) U.S. Cl.
CPC ....... *H05K 1/145* (2013.01); *H01L 23/49805* (2013.01); *H01L 23/49838* (2013.01);
(Continued)

(58) Field of Classification Search
CPC ...... H05K 1/111; H05K 1/145; H05K 3/3436; H05K 2201/10719; H01L 23/482;
(Continued)

(56) References Cited

U.S. PATENT DOCUMENTS 6,665,194 B1 * 12/2003 Patel .................. H05K 1/145
361/767
6,689,634 B1 * 2/2004 Lyne .................. H05K 1/112
438/106
(Continued)

FOREIGN PATENT DOCUMENTS

| JP | 2000100986 A | 4/2000 |
| JP | 2002270723 A | 9/2002 |
| JP | 2005005601 A | 1/2005 |

OTHER PUBLICATIONS

International Search Report for Application No. PCT/EP2018/071190 dated Oct. 24, 2018 (English Translation, 2 pages).
(Continued)

*Primary Examiner* — Allan R Wilson
(74) *Attorney, Agent, or Firm* — Michael Best & Friedrich LLP (57) ABSTRACT

The invention relates to a semiconductor component (2), comprising a semiconductor chip (3), a housing (5) and a connection point arrangement (10) having at least two rows (14, 16) of planar connection points (12), which are arranged on a bottom side of the housing (5) and can be electrically connected by means of connections to corresponding contacts of a contact arrangement having at least two rows, which contact arrangement is arranged on a printed circuit board, wherein the geometry of the contact arrangement corresponds to the geometry of the connection point arrangement (10), a first distance is specified between two adjacent first connection points (14A) of a first row (14) of the connection point arrangement (10) and a second distance (Continued)

is specified between two adjacent second connection points (16A) of a second row (16) of the connection point arrangement (10), and the second connection points (16A) of the second row (16) are offset to the first connection points (14A) of the first row (14). The invention also relates to a corresponding contacting assembly having such a semiconductor element (2) and a printed circuit board. The first distance at least between two adjacent first connection points (14A) of the first row (14) of the connection point arrangement (10) corresponds to an intermediate space (C, D) between two contacts of the corresponding contact arrangement, in which intermediate space at least two conducting tracks (28) having functionally reliable dimensions and distances can be arranged.

14 Claims, 6 Drawing Sheets

(51) Int. Cl.
*H05K 3/34* (2006.01)
*H01L 23/498* (2006.01)

(52) U.S. Cl.
CPC ............ *H05K 1/111* (2013.01); *H05K 3/3436* (2013.01); *H01L 2924/1532* (2013.01); *H05K 2201/09772* (2013.01); *H05K 2201/10719* (2013.01)

(58) Field of Classification Search
CPC ............. H01L 23/49541; H01L 23/498; H01L 23/49805; H01L 23/49838; H01L 24/49; H01L 2224/49171; H01L 2924/00; H01L 2924/1532
See application file for complete search history.

(56) References Cited

U.S. PATENT DOCUMENTS

2003/0165051 A1* 9/2003 Kledzik .................. H05K 1/14
257/E25.011
2004/0262752 A1 12/2004 Ito et al.

OTHER PUBLICATIONS

Anonymous, "Application Notes for Surface Mount Assembly of Amkar's Dual Row MicroLeadFrame (MLF) Packages Rev. A", Aug. 1, 2005, pp. 1-16.

* cited by examiner

SEMICONDUCTOR COMPONENT, AND CONTACTING ASSEMBLY HAVING A SEMICONDUCTOR COMPONENT AND A PRINTED CIRCUIT BOARD

BACKGROUND OF THE INVENTION

The invention proceeds from a semiconductor component. The subject of the present invention is also a contact-making arrangement having a semiconductor component and a printed circuit board.

Semiconductor components (ICs) are continually being miniaturized (Moore's law) for reasons of cost and performance, wherein the number of electrical connections of a semiconductor component per surface area increases. Said increasing integration density on the semiconductor component plane simultaneously requires a corresponding increase in the integration densities in the semiconductor component housing (IC package). The reasons for this are cost and performance, like in the semiconductor component itself. Semiconductor component housings have developed further in the process of higher integration of constructions with peripheral connection points (SOIC, QFP, QFN) to those having multi-row flat connection points (multi-row QFN, FusionQuad) or so-called area array constructions (BGA, LGA, WLP). A characteristic of the integration density of semiconductor component housings is a mutual distance dimension of the connection points (pitch). Currently, minimum distance dimensions of 0.4 mm both for peripheral as well as area array constructions are prior art. The miniaturization is as standard always linked to a decrease in size of the mutual distance dimension of the connection points (pitch).

Quad flat no-leads package (QFN package) is a conventional housing design for integrated circuits or semiconductor components. The designation comprises different sizes of housings, which are soldered to printed circuit boards as surface-mounted components. As an essential feature and in contrast to the similar quad flat package (QFP), the electrical connection points do not project laterally over the dimensions of the housing but are integrated, for example, in the form of non-tin-plated copper connection points into the bottom side of the housing in a flat manner. As a result thereof, the required space on the printed circuit board can be reduced and a higher packing density can be achieved.

The use of larger scale and large scale integrated semiconductor component housings requires the ease of processing thereof on suitable printed circuit boards. Printed circuit board technologies are separated into rough standard technologies with mechanically drilled and galvanized vias and into finer high-density interconnect technologies (HDI technologies), which permit smaller distances for the wiring of the components on the printed circuit board on account of laser-drilled vias. The HDI technology leads to higher costs compared to standard technology on account of the more complex production method. In general, large scale and very large scale integrated semiconductor component housings require printed circuit boards in HDI technology.

"Application Notes for Surface Mount Assembly of Amkor's Dual Row MLF Packages", August 2005, Rev. A discloses a semiconductor component having a semiconductor chip, a housing and a connection point arrangement having at least two rows of flat connection points, which are arranged on a bottom side of the housing and can be electrically connected via connections to corresponding contacts of a contact arrangement having at least two rows, said contact arrangement being arranged on a printed circuit board. The geometry of the contact arrangement corresponds to the geometry of the connection point arrangement, wherein a first distance is specified between two adjacent first connection points of a first row of the connection point arrangement and a second distance is specified between two adjacent second connection points of a second row of the connection point arrangement. The second connection points of the second row are arranged offset to the first connection points of the first row. The first distances between two adjacent first connection points of the first row and the second distances between two adjacent second connection points of the second row have identical values. Possible values disclosed for the distances are 500 µm or 650 µm. The first distance between two adjacent first connection points of the first row of the connection point arrangement corresponds to an intermediate space between two contacts of the corresponding contact arrangement of the printed circuit board, in which intermediate space a conductor track having functionally reliable dimensions and distances can be arranged, said conductor track making contact with a second contact of the second row.

SUMMARY OF THE INVENTION

The semiconductor component according to the invention and the contact-making arrangement having a semiconductor component and a printed circuit board according to the invention have the advantage that the connection point arrangement of the semiconductor component is compatible with cost-effective standard printed circuit board technologies despite a high integration density. This is achieved by virtue of the distances between the flat connection points of the connection point arrangement being configured such that wiring on a printed circuit board in standard technology is possible. In the same way, vias between the contact rows of the contact arrangement can be realized by way of said flexible construction of the connection point arrangement.

By increasing the size of the first distance between at least two adjacent connection points of the first row of the connection point arrangement, it is possible, in the case of a multi-row connection point arrangement having flat connection points, such as, for example, in the case of a multi-row QFN, to achieve miniaturization, which can further be separated from printed circuit boards produced with inexpensive standard technology.

In order to separate such a multi-row connection point arrangement having a contact arrangement from a printed circuit board produced using standard technology, it is necessary to separate all connection points of the connection point arrangement via contacts and conductor tracks on the printed circuit board. In embodiments of the semiconductor component according to the invention and the contact-making arrangement according to the invention, in contrast to the prior art, miniaturization or an increase in the wiring density can be achieved by increasing the size of the distance between two adjacent first connection points of the first row of the connection point arrangement or between two adjacent first contacts of the first row of the contact arrangement, since the second distance between two adjacent second connection points of a second row of the connection point arrangement or between two adjacent second contacts of the second row of the contact arrangement can be reduced to a minimum contact distance, wherein the higher number of second contacts of the second row can be approached via the conductor tracks led between the adjacent first contacts of the first row in the intermediate space.

Embodiments of the present invention provide a semiconductor component having a semiconductor chip, a housing and a connection point arrangement having at least two rows of flat connection points, which are arranged on a bottom side of the housing and can be electrically connected via connections to corresponding contacts of a contact arrangement having at least two rows, said contact arrangement being arranged on a printed circuit board. The geometry of the contact arrangement corresponds to the geometry of the connection point arrangement, wherein a first distance is specified between two adjacent first connection points of a first row of the connection point arrangement and a second distance is specified between two adjacent second connection points of a second row of the connection point arrangement. The second connection points of the second row are arranged offset to the first connection points of the first row. In this case, the first distance at least between two adjacent first connection points of the first row of the connection point arrangement corresponds to an intermediate space between two contacts of the corresponding contact arrangement, in which intermediate space at least two conductor tracks having functionally reliable dimensions and distances can be arranged.

In addition, a contact-making arrangement having a semiconductor component, which comprises a semiconductor chip, a housing and a connection point arrangement having at least two rows of flat connection points, which are arranged on a bottom side of the housing, and a printed circuit board is proposed, which comprises a contact arrangement having at least two rows of contacts. The geometry of the contact arrangement corresponds to the geometry of the connection point arrangement and the connection points of the connection point arrangement are electrically connected via connections to corresponding contacts of the contact arrangement. In addition, the connection points of the connection point arrangement are separated by way of the contacts of the contact arrangement and by way of conductor tracks of the printed circuit board. A first distance is specified between two adjacent first connection points of a first row of the connection point arrangement and between two adjacent first contacts of a first row of the contact arrangement, and a second distance is specified between two adjacent second connection points of a second row of the connection point arrangement and between two adjacent second contacts of a second row of the contact arrangement. The second connection points and the second contacts of the respective second row are arranged offset to the first connection points and the first contacts of the respective first row, wherein the second contacts of the second row are able to be contacted via the conductor tracks, which are each led through an intermediate space between two adjacent contacts of the first row. In this case, the first distance at least between two adjacent first connection points of the first row of the connection point arrangement and between two corresponding adjacent first contacts of the first row of the contact arrangement corresponds to an intermediate space between two contacts of the contact arrangement, in which intermediate space at least two conductor tracks having functionally reliable dimensions and distances can be arranged, said at least two conductor tracks each making contact with a second contact of the second row.

In the following text, the semiconductor component is understood to be an integrated circuit or a semiconductor chip in a quad flat no-leads package (QFN package) whose flat electrical connection points are arranged on a bottom side of the housing.

In one advantageous configuration of the contact-making arrangement, the first distances between two adjacent first connection points and between two adjacent first contacts of the respective first row may have identical values. As an alternative, the first distances between two adjacent first connection points and between two adjacent first contacts of the respective first row may have different values. As a result thereof, the connection point arrangement and the contact arrangement can be adapted to various requirements in a flexible and simple manner. The distances between two adjacent first connection points or first contacts of the respective first row may thus all have the same value, for example. As an alternative, the distances between two adjacent first connection points or first contacts may vary. For example, a first intermediate space between two adjacent first contacts may thus represent a minimum contact distance, such that no conductor track can be led in the first intermediate space and no second contact of the second row of the contact arrangement can be approached. This makes possible a wiring density of approximately 2.5 signals/mm using common technologies. Only one conductor track can be led between two adjacent first contacts in a second intermediate space, such that a second contact of the second row of the contact arrangement can be approached. This makes possible a wiring density in the range of between 3 and 3.33 signals/mm using common technologies. In addition or as an alternative to the embodiment having the described at least one second intermediate space, two conductor tracks can be led between two adjacent first contacts in a third intermediate space, such that two second contacts of the second row of the contact arrangement can be approached. This makes possible a wiring density in the range of between 3.25 and 3.75 signals/mm using common technologies. In addition or as an alternative to the embodiment having the described at least one second and/or third intermediate space, three conductor tracks can be led between two adjacent first contacts in a fourth intermediate space, such that three second contacts of the second row of the contact arrangement can be approached. This makes possible a wiring density of approximately 3.4 signals/mm using common technologies. In this way, it is therefore possible to implement contact arrangements that comprise any conceivable combinations of at least in each case one, with the same or a different number, of the above-described first and/or second and/or third and/or fourth intermediate spaces.

In a further advantageous configuration of the contact-making arrangement, the second distances between two adjacent second connection points and between two adjacent second contacts of the respective second row may have identical values or different values. A respective minimum connection point distance or contact distance between two adjacent second connection points or second contacts of the respective second row can preferably be selected in order to be able to implement the greatest possible number of second connection points or second contacts in the respective second row. As an alternative, the distances between two adjacent second connection points or second contacts may vary in order to adapt the respective second row to the respective first row and to make possible an approach of the second connection points or second contacts. To facilitate the approach of the second connection points or second contacts, the second connection points and the second contacts of the respective second row may be oriented symmetrically to a center of the associated intermediate space between two adjacent first connection points and between two adjacent first contacts of the respective first row.

In a further advantageous configuration of the contact-making arrangement, a wiring density VDK in a section of the contact arrangement can be calculated according to the formula VDK=kk/(mpb+4*rv+2*kü+n*mlb+(n−1)*mla), wherein kk represents a contact number in the section in question, mpb represents a minimum contact width, rv represents a maximum resist offset, kü represents a minimum edge covering, n represents a conductor track number in the intermediate space between two adjacent first contacts, mlb represents a minimum conductor track width and mla represents a minimum conductor track distance. Using common technologies, the number of conductor tracks between two adjacent contacts may vary in the range of from 1 to 3.

Exemplary embodiments of the invention are illustrated in the drawing and are explained in more detail in the description that follows. In the drawing, identical reference signs denote component parts or elements that perform identical or analogous functions.

DETAILED DESCRIPTION

As can be seen from FIGS. 1 to 5, the illustrated exemplary embodiment of a semiconductor component 2 according to the invention comprises a semiconductor chip 3, a housing 5 and a connection point arrangement 10 having at least two rows 14, 16 of flat connection points 12, which are arranged on a bottom side of the housing 5 and are able to be electrically connected via connections 9 to corresponding contacts 22 of a contact arrangement 20 having at least two rows 24, 26, said contact arrangement being arranged on a printed circuit board 7. The geometry of the contact arrangement 20 corresponds to the geometry of the connection point arrangement 10, wherein a first distance is specified between two adjacent first connection points 14A of a first row 14 of the connection point arrangement 10, and a second distance is specified between two adjacent second connection points 16A of a second row 16 of the connection point arrangement 10. In addition, the second connection points 16A of the second row 16 are arranged offset to the first connection points 14A of the first row 14. In this case, the first spacing at least between two adjacent first connection points 14A of the first row 14 of the connection point arrangement 10 corresponds to an intermediate space C, D between two contacts 22 of the corresponding contact arrangement 20, in which intermediate space at least two conductor tracks 28 having functionally reliable dimensions and distances can be arranged.

Figure 1:
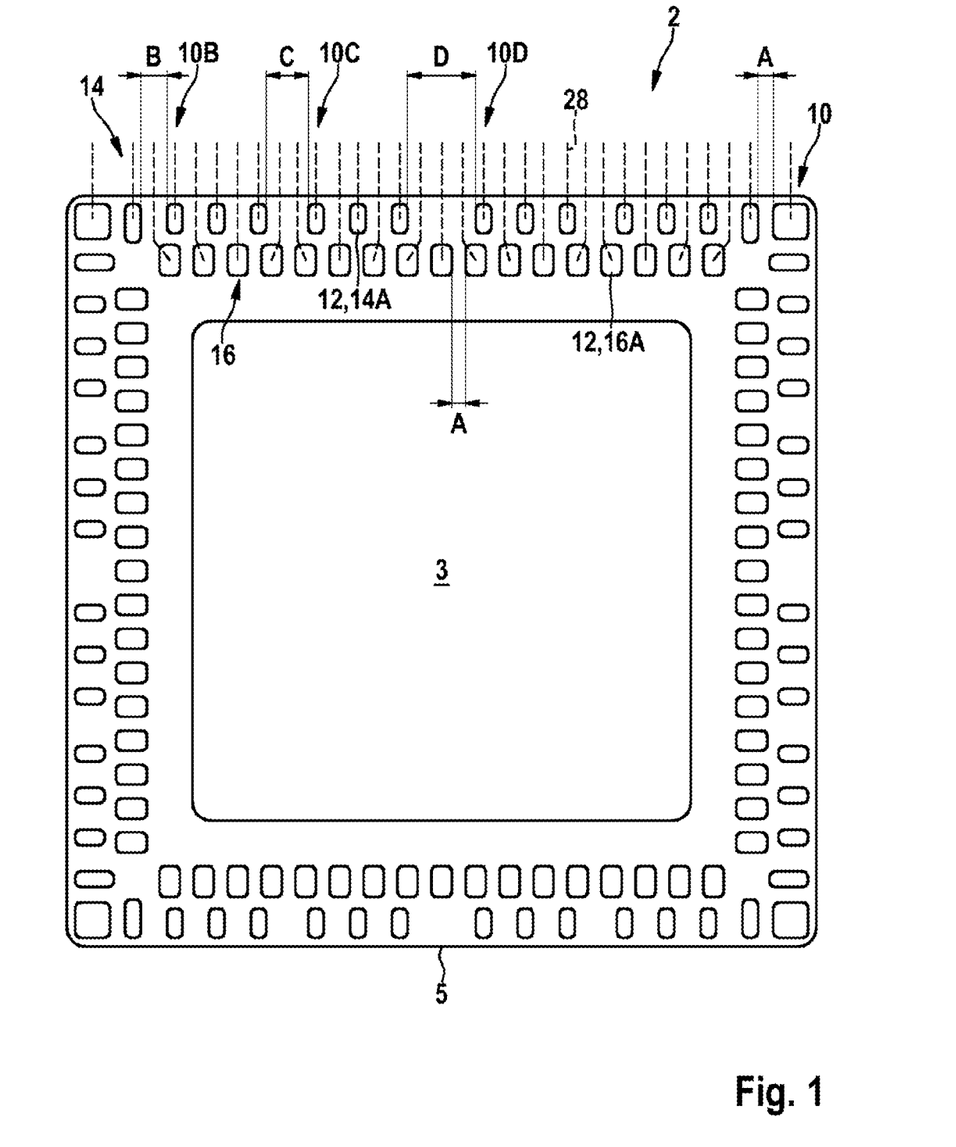
FIG. 1 shows a schematic illustration of an exemplary embodiment of a semiconductor component according to the invention from below.

As can further be seen from FIGS. 1 to 7, the contact-making arrangement 1 in the illustrated exemplary embodiment comprises the semiconductor component 2 illustrated in FIG. 1 and described above and a printed circuit board 7. The printed circuit board 7 comprises a contact arrangement 20 having at least two rows 24, 26 of contacts 22, wherein the geometry of the contact arrangement 20 corresponds to the geometry of the connection point arrangement 10 and the connection points 12 of the connection point arrangement 10 are electrically connected via connections 9, preferably via solder connections, to corresponding contacts 22 of the contact arrangement 20. The connection points 12 of the connection point arrangement 10 are separated by way of the contacts 22 of the contact arrangement 20 and by way of conductor tracks 28 of the printed circuit board 7, wherein a first distance is specified between two adjacent first connection points 14A of a first row 14 of the connection point arrangement 10 and between two adjacent first contacts 24A of a first row 24 of the contact arrangement 20, and a second distance is specified between two adjacent second connection points 16A of a second row 16 of the connection point arrangement 10 and between two adjacent second contacts 26A of a second row 26 of the contact arrangement 20. As can further be seen from FIGS. 1, 6 and 7, the second connection points 16A and the second contacts 26A of the respective second row 16, 26 are arranged offset to the first connection points 14A and the first contacts 24A of the respective first row 14, 24. In addition, the second contacts 26A of the second row 26 are able to be contacted via the conductor tracks 28, which are each led through an intermediate space B, C, D between two adjacent contacts 24A of the first row 24. In this case, the first distance at least between two adjacent first connection points 14A of the first row 14 of the connection point arrangement 10 and between two corresponding adjacent first contacts 24A of the first row 24 of the contact arrangement 20 corresponds to an intermediate space C, D between two contacts 22 of the contact arrangement 20, in which intermediate space at least two conductor tracks 28 having functionally reliable dimensions and distances can be arranged, said at least two conductor tracks each making contact with a second contact 26A of the second row 26.

As can further be seen, in particular, from FIGS. 1 to 7, the connection point arrangement 10 and the contact arrangement 20 in the illustrated exemplary embodiment each have a plurality of sections 10C, 20C, at which the first distance between two adjacent first connection points 14A of the first row 14 of the connection point arrangement 10 and between two adjacent first contacts 24A of the first row 24 of the contact arrangement 20 corresponds in each case to an intermediate space C, in which two conductor tracks 28 having functionally reliable dimensions and distances can be led between two first contacts 24A of the first row 24 of the contact arrangement 20. In FIG. 1, the conductor tracks 28 are illustrated using dots. In addition, the connection point arrangement 10 and the contact arrangement 20 in the illustrated exemplary embodiments each have a plurality of sections 10D, 20D, at which the first distance between two adjacent first connection points 14A of the first row 14 of the connection point arrangement 10 and between two adjacent first contacts 24A of the first row 24 of the contact arrangement 20 corresponds in each case to an intermediate space D, in which three conductor tracks 28 having functionally reliable dimensions and distances can be led between two first contacts 24A of the first row 24 of the contact arrangement 20. Furthermore, the connection point arrangement 10 and the contact arrangement 20 in the illustrated exemplary embodiments each have a plurality of sections 10B, 20B, at which the first distance between two adjacent first connection points 14A of the first row 14 of the connection point arrangement 10 and between two adjacent first contacts 24A of the first row 24 of the contact arrangement 20 corresponds in each case to an intermediate space B, in which only one conductor track 28 having functionally reliable dimensions and distances can be led between two first contacts 24A of the first row 24 of the contact arrangement 20. Moreover, the connection point arrangement 10 and the contact arrangement 20 in the illustrated exemplary embodiments each have a plurality of sections 10A, 20A at which the first distance between two adjacent first connection points 14A of the first row 14 of the connection point arrangement 10 and between two adjacent first contacts 24A of the first row 24 of the contact arrangement 20 corresponds to a minimum connection point distance mta or to a minimum contact distance mpa, such that no conductor track 28 having functionally reliable dimensions and distances can be led between two contacts 22 of the corresponding contact arrangement 20 in the intermediate space A. Therefore, the connection point arrangement 10 and the contact arrangement 20 in the illustrated exemplary embodiments each have a combination of first distances between two adjacent first connection points 14A of the first row 14 of the connection point arrangement and between two adjacent first contacts 24A of the first row 24 of the contact arrangement 20 with four different values. In the case of alternative exemplary embodiments which are not illustrated, the connection point arrangement 10 and the contact arrangement 20 may have a different number of first distances with different values and a different combination of the first distances with different values. The connection point arrangement 10 and the contact arrangement 20 can thus have in the respective first row 14, 24, for example, only a combination of first distances between two adjacent first connection points 14A or first contacts 24A, which correspond to an intermediate space C or to an intermediate space D. In addition, the connection point arrangement 10 and the contact arrangement 20 can have in the respective first row 14, 24, for example, only identical first distances between two adjacent first connection points 14A or first contacts 24A, which correspond to an intermediate space C, or only identical first distances between two adjacent first connections points 14A or first contacts 24A, which correspond to an intermediate space D.

As can further be seen from FIG. 1, the two distances between two adjacent second connection points 16A of the second row 16 of the connection point arrangement 10 in the illustrated exemplary embodiment of the semiconductor component 2 according to the invention have identical values. In this case, the second distance between two adjacent second connection points 16A corresponds to a minimum connection point distance mta, which still makes possible a reliable function of the semiconductor component. In addition, the four first flat connection points 14A arranged at the corners of the housing 5 in the illustrated exemplary embodiment each have a greater surface area than the other first flat connection points 14A of the first row 14 of the connection point arrangement 10. Furthermore, the second connection points 16A of the second row 16 of the connection point arrangement 10 each have a greater surface area than the first flat connection points 14A of the first row 14 of the connection point arrangement 10.

Figure 6:
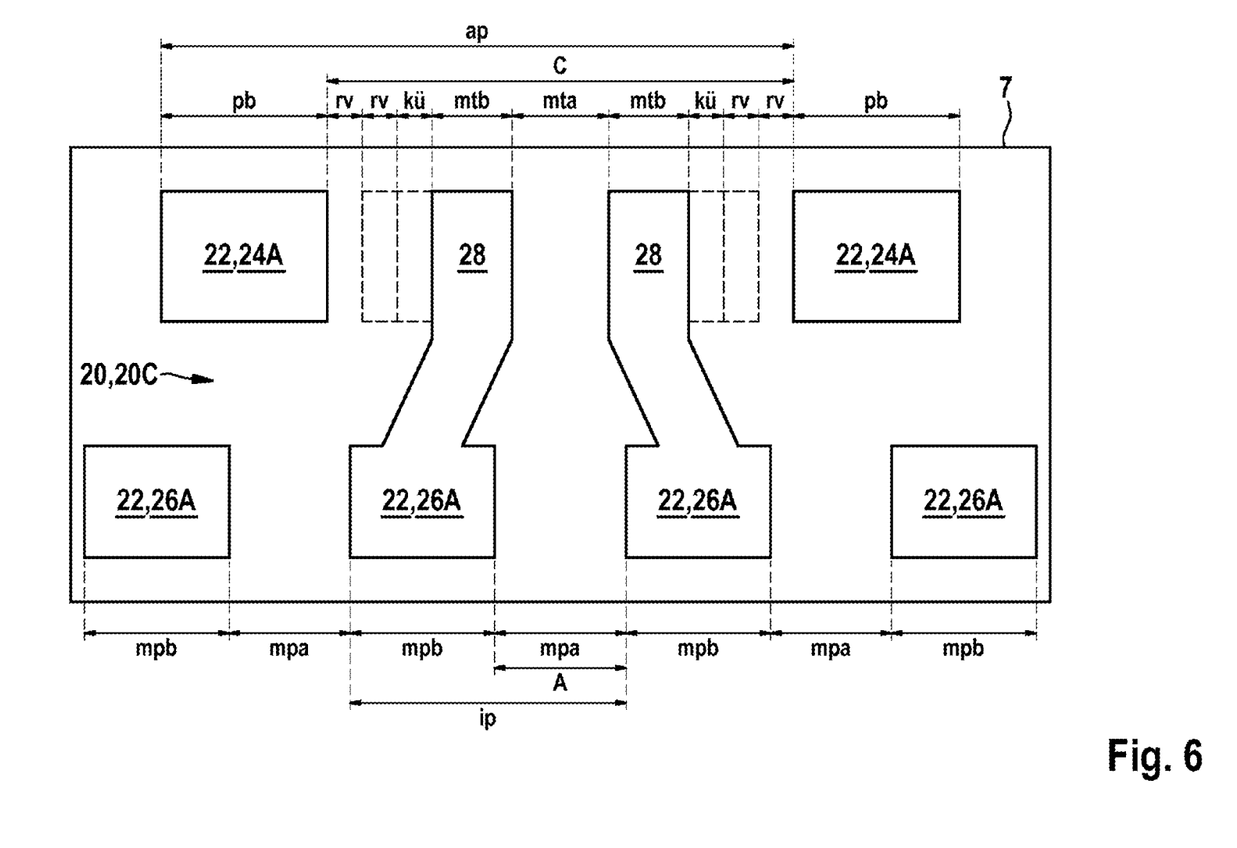
FIG. 6 shows a schematic illustration of a third section of an exemplary embodiment of a printed circuit board of the contact-making arrangement according to the invention from FIG. 4 from above.
Figure 7:
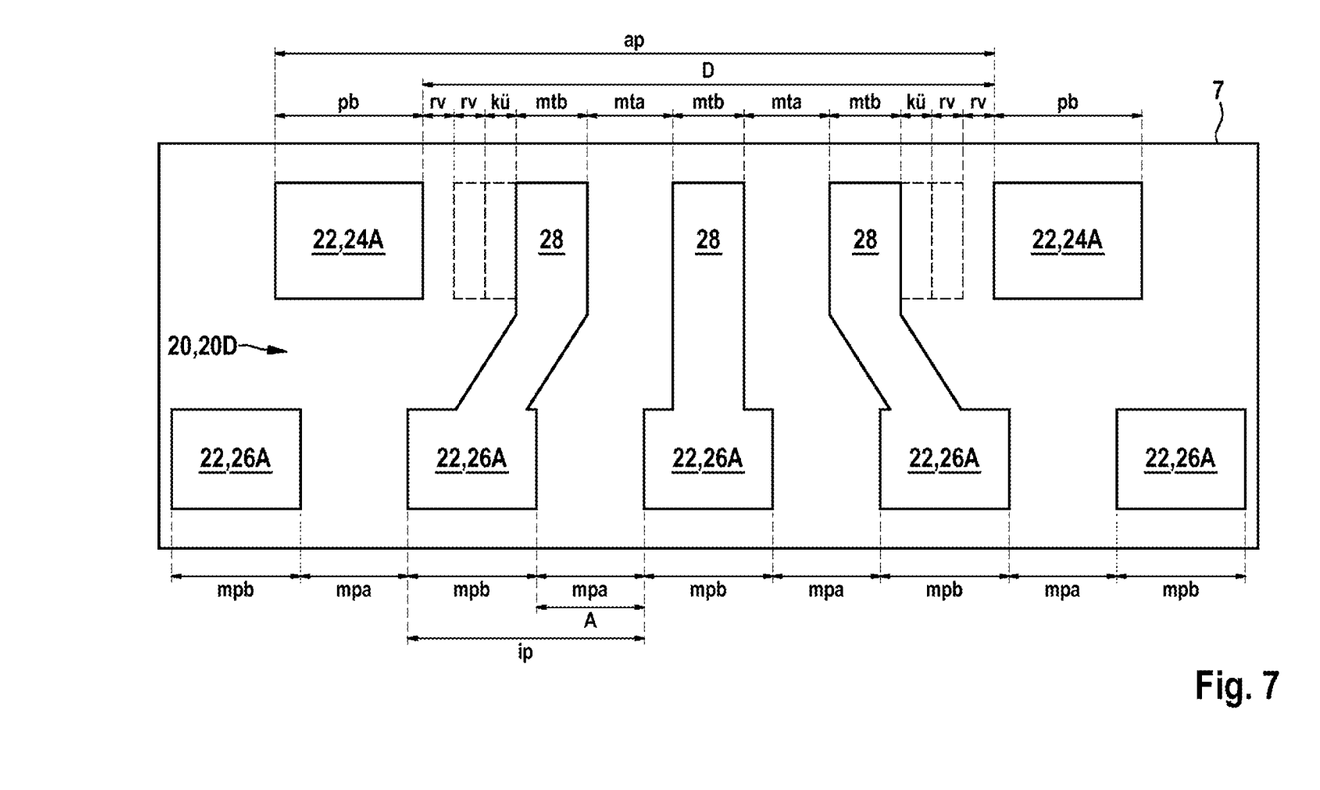
FIG. 7 shows a schematic illustration of a fourth section of an exemplary embodiment of a printed circuit board of the contact-making arrangement according to the invention from FIG. 5 from above.

As can further be seen from FIGS. 6 and 7, the second distances between two adjacent second contacts 26A of the second row 26 of the contact arrangement 20 in the illustrated exemplary embodiment have identical values in a manner analogous to the connection point arrangement 10. In this case, the second distance between two adjacent second contacts 26A corresponds to a minimum contact distance mpa, which still makes possible a reliable function of the contact-making arrangement 1.

Figure 2:
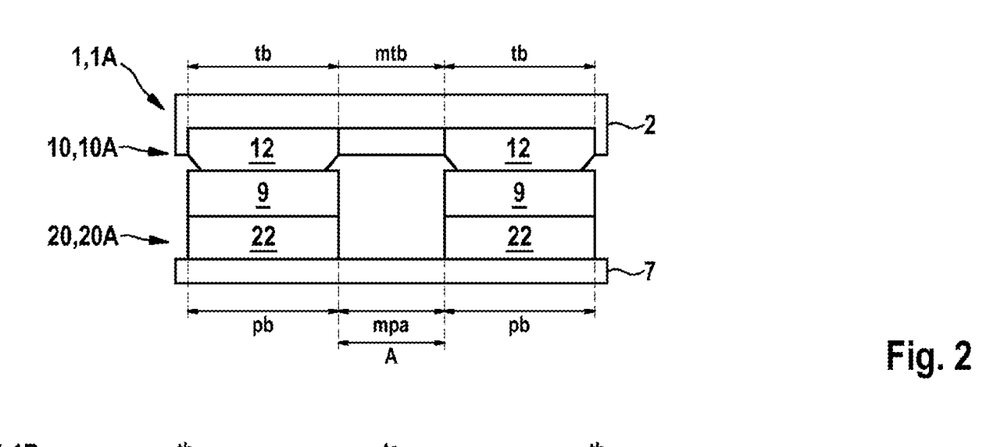
FIG. 2 shows a schematic sectional illustration of a first section of an exemplary embodiment of a contact-making arrangement according to the invention having the semiconductor component from FIG. 1 and a printed circuit board.

As can further be seen from FIG. 2, the illustrated first intermediate space A between two adjacent contacts 22 represents a minimum contact distance mpa, which in the illustrated exemplary embodiment also corresponds to a minimum connection point distance mta between two adjacent connection points 12. Since cost-effective standard technologies are used to produce the printed circuit board 7, a value of 200 µm results for the minimum connection point distance mta or minimum contact distance mpa and therefore for the first intermediate space A. A value of 200 µm is assumed for the connection point width tb and the contact width pb in each case. A distance dimension (pitch) can be calculated from the sum of the contact width pb and the minimum contact distance mpa and a value of 400 µm results for the illustrated section 20A of the contact arrangement 20. As a result thereof, a wiring density of 2.5 signals/mm results using the standard technology used.

Figure 3:
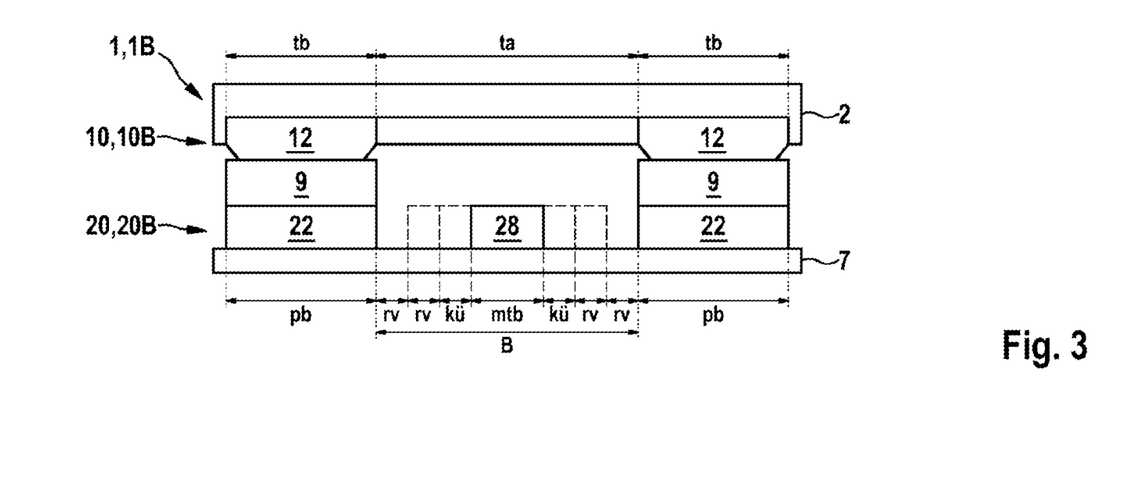
FIG. 3 shows a schematic sectional illustration of a second section of the contact-making arrangement according to the invention from FIG. 2.
Figure 4:
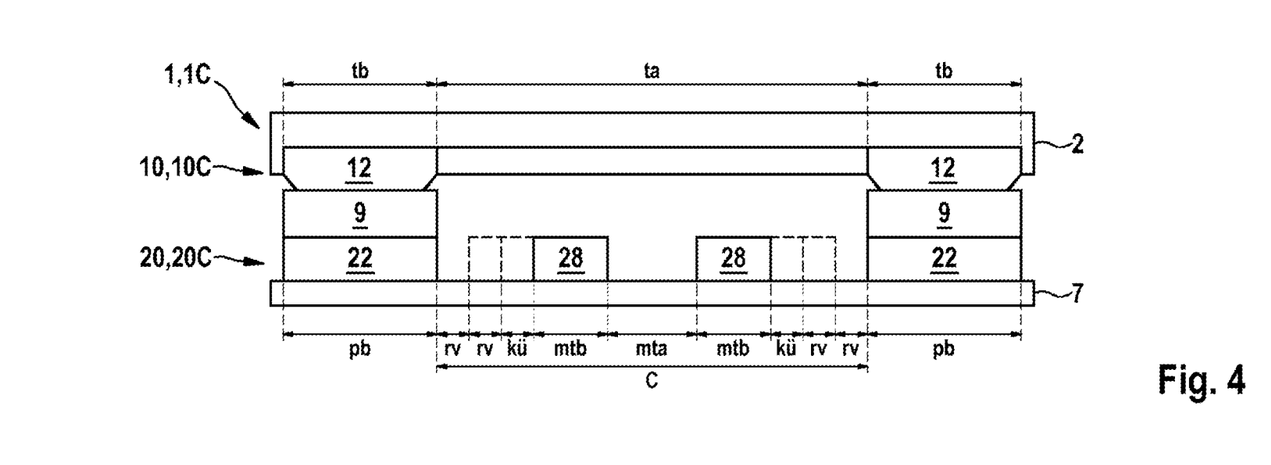
FIG. 4 shows a schematic sectional illustration of a third section of the contact-making arrangement according to the invention from FIGS. 2 and 3.
Figure 5:
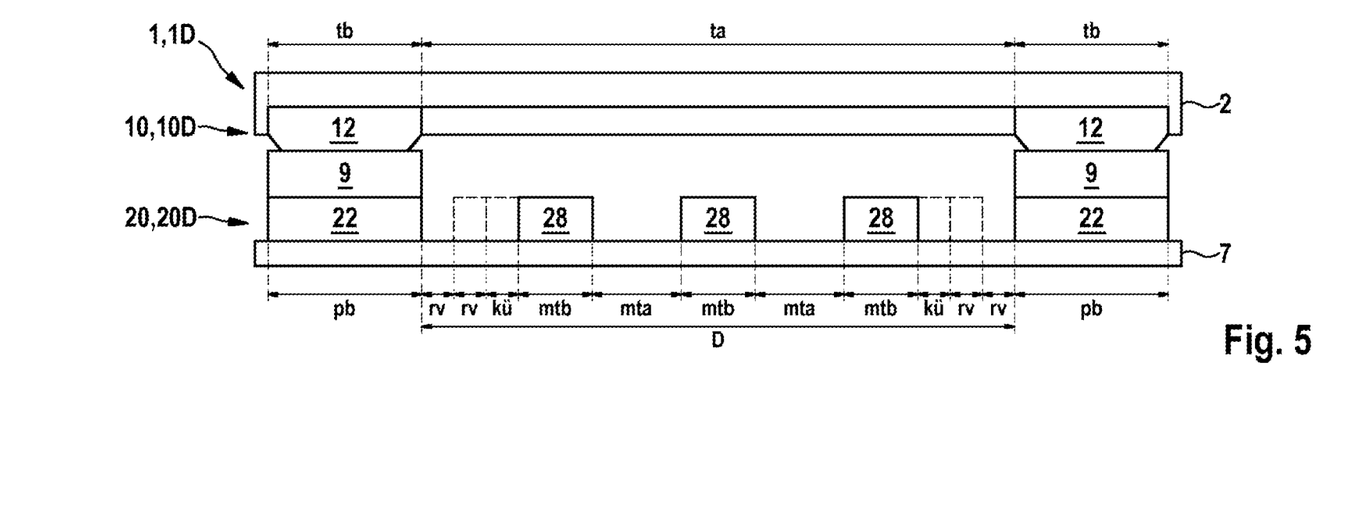
FIG. 5 shows a schematic sectional illustration of a fourth section of the contact-making arrangement according to the invention from FIGS. 2 to 4.

As can further be seen from FIGS. 3 to 5, in each case at least one conductor track 28 is led between two adjacent contacts 22 in the illustrated intermediate spaces B, C, D. Therefore, the width Br of the intermediate spaces B, C, D or the corresponding connection point distance to or the corresponding contact distance pa can be calculated according to equation (1):

$$Br=ta=pa=(4*rv+2*kü+n*mlb+(n-1)*ml) \quad (1)$$

In this case, rv represents a maximum resist offset, kü represents a minimum edge covering, n represents a number of conductor tracks in the intermediate space (B, C, D) between two adjacent contacts 22, mlb represents a minimum conductor track width and mla represents a minimum conductor track distance. The intermediate spaces B, C, D are thus made up of the conductor track widths 1b of the conductor tracks used and a plurality of technology-dependent distances, which are retained for the reliable function of the contact-making arrangement 1. The respective distance dimension (pitch) can be calculated from the sum of the contact width pb and the width Br of the intermediate spaces B, C, D for the illustrated sections 20B, 20C, 20D of the contact arrangement 20. The corresponding wiring density VDK in the sections 10B, 10C, 10D of the contact arrangement 20 can be calculated according to equation (2):

$$VDK=kk/(mpb+Br) \quad (2)$$

In this case, kk represents a number of contacts in the section 10B, 10C, 10D in question, mpb represents a minimum contact width and Br represents the width of the intermediate space B, C, D between two adjacent contacts 22.

As can further be seen from FIG. 3, only one conductor track 28 is led between two adjacent contacts 22 in the illustrated second intermediate space B. Therefore, the width Br of the second intermediate space B can be calculated according to equation (1). The standard technology used has a minimum conductor track width mlb of 125 μm, a minimum conductor track distance mla of 125 μm, a maximum resist offset of 50 μm and a minimum edge covering of 50 μm. Therefore, a value of 425 μm results for the width Br of the second intermediate space B according to equation (1). The distance dimension (pitch) can be calculated from the sum of the contact width pb and the width Br of the second intermediate space B and results in a value of 625 μm for the illustrated section 20B of the contact arrangement 20. As a result thereof, a wiring density between 3 and 3.33 signals/mm results using the standard technology used.

As can further be seen from FIGS. 4 and 6, two conductor tracks 28 are led between two adjacent contacts 22 in the illustrated third intermediate space C. Therefore, the width Br of the third intermediate space C can be calculated according to equation (1). With the standard technology used, a value of 675 μm results for the width Br of the third intermediate space C according to equation (1). The distance dimension (pitch) can be calculated from the sum of the contact width pb and the width Br of the third intermediate space C and results in a value of 825 μm for the illustrated section 20C of the contact arrangement 20. As a result thereof, a wiring density between 3.25 and 3.75 signals/mm results using the standard technology used.

As can further be seen from FIGS. 5 and 7, three conductor tracks 28 are led between two adjacent contacts 22 in the illustrated fourth intermediate space C. Therefore, the width Br of the fourth intermediate space D can be calculated according to equation (1). A value of 925 μm results for the width Br of the fourth intermediate space D according to equation (1) using the standard technology used. The distance dimension (pitch) can be calculated from the sum of the contact width pb and the width Br of the fourth intermediate space D and results in a value of 1125 μm for the illustrated section 20D of the contact arrangement 20. As a result thereof, a wiring density of approximately 3.4 signals/mm results using the standard technology used. By using the standard technology, a maximum of three conductor tracks 28 can be led between two adjacent contacts 22 in the intermediate space D in order to still achieve miniaturization.

Figure 8:
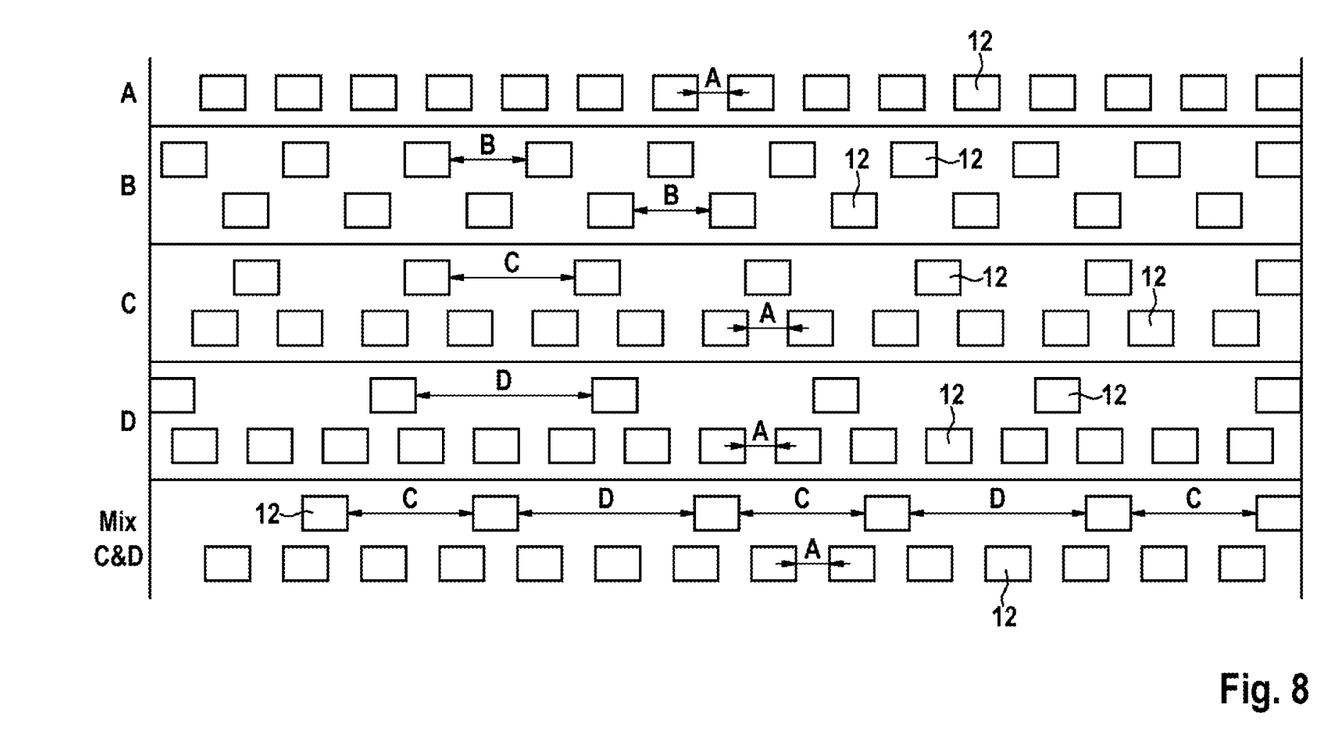
FIG. 8 shows a schematic illustration of different connection point arrangements of a semiconductor component from above.

FIG. 8 shows various connection point arrangements of a semiconductor component from above. In this case, a first connection point arrangement known from the prior art and illustrated in the first or topmost section has only one row with 15 flat connection points 12. In this case, the distances or intermediate spaces A between two adjacent connection points 12 are identical. A second connection point arrangement known from the prior art and illustrated in the second section has two rows of flat connection points 12. In this case, the distances or intermediate spaces B between two adjacent connection points 12 of the first or second row are identical. In each case one conductor track can be led in the intermediate spaces B. Overall, the second connection point arrangement has 19 connection points 12 in the illustrated second section. That is four connection points 12 more than in the case of the first connection point arrangement. A third connection point arrangement illustrated in the third section has two rows of flat connection points 12. In this case, the distances or intermediate spaces A, C between two adjacent connection points 12 of the first rows and of the second row are different. The distances or intermediate spaces A between two adjacent connection points 12 of the second row have an identical distance A, which corresponds to a minimum contact distance. The distances or intermediate spaces C between two adjacent connection points 12 of the first row are likewise identical but are embodied to be of a size such that in each case two conductor tracks can be led in the intermediate spaces C. Overall, the third connection point arrangement has 20 connection points 12 in the illustrated third section. That is five connection points 12 more than in the case of the first connection point arrangement and one connection point 12 more than in the case of the second connection point arrangement. A fourth connection point arrangement illustrated in the fourth section has two rows of flat connection points 12. In this case the distances or intermediate spaces A, D between two adjacent connection points 12 of the first rows and of the second row are different. The distances or intermediate spaces A between two adjacent connection points 12 of the second row have an identical distance A, which corresponds to a minimum contact distance. The distances or intermediate spaces D between two adjacent connection points 12 of the first row are likewise identical but are embodied to be of a size such that in each case three conductor tracks can be led in the intermediate spaces C. Overall, the fourth connection point arrangement has 21 connection points 12 in the illustrated fourth section. That is six connection points 12 more than in the case of the first connection point arrangement and two connection points more than in the case of the second connection point arrangement and one connection point 12 more than in the third connection point arrangement. A fifth connection point arrangement illustrated in the fifth section has two rows of flat connection points 12. In this case, the distances or intermediate spaces A, C, D between two adjacent connection points 12 of the first rows and of the second row are different. The distances or intermediate spaces A between two adjacent connection points 12 of the second row have an identical distance A, which corresponds to a minimum contact distance. The distances or intermediate spaces C, D between two adjacent connection points 12 of the first row have different values. In this case, intermediate spaces C, in which in each case two conductor tracks can be led, alternate with intermediate spaces D, in which in each case three conductor tracks can be led. Overall, the fifth connection point arrangement has 20 connection points 12 in the illustrated fifth section. That is five connection points 12 more than in the case of the first connection point arrangement and one connection point more than in the case of the second connection point arrangement. As can further be seen from FIG. 8, the connection points 12 of the respective second row are oriented symmetrically to a center of the associated intermediate space B, C, D between two adjacent connection points 12 of the respective first row.

The invention claimed is:

1. A semiconductor component (2) comprising a semiconductor chip (3), a housing (5) and a connection point arrangement (10) having at least two rows (14, 16) of flat connection points (12), wherein the connection points (12) are arranged on a bottom side of the housing (5) and are configured to be electrically connected via connections (9) to corresponding contacts (22) of a contact arrangement (20) having at least two rows (24, 26), said contact arrangement being arranged on a printed circuit board (7), wherein a geometry of the contact arrangement (20) corresponds to a geometry of the connection point arrangement (10), wherein a first distance is specified between two adjacent first connection points (14A) of a first row (14) of the connection point arrangement (10) and a second distance is specified between two adjacent second connection points (16A) of a second row (16) of the connection point arrangement (10), wherein the second connection points (16A) of the second row (16) are arranged offset to the first connection points (14A) of the first row (14), characterized in that the first distance at least between two adjacent first connection points (14A) of the first row (14) of the connection point arrangement (10) corresponds to an intermediate space (C, D) between two contacts (22) of the corresponding contact arrangement (20), in which intermediate space at least two conductor tracks (28) having functionally reliable dimensions and distances can be arranged.

2. The semiconductor component (2) as claimed in claim 1, characterized in that the first distances between two adjacent first connection points (14A) of the first row (14) have identical values or different values.

3. The semiconductor component (2) as claimed in claim 1, characterized in that the second distances between two adjacent second connection points (16A) of the second row (16) have identical values or different values.

4. A contact-making arrangement (1) comprising
a semiconductor component (2), which comprises a semiconductor chip (3), a housing (5) and a connection point arrangement (10) having at least two rows (14, 16) of flat connection points (12), wherein the connection points (12) are arranged on a bottom side of the housing (5), and
a printed circuit board (7), which comprises a contact arrangement (20) having at least two rows (24, 26) of contacts (22), wherein a geometry of the contact arrangement (20) corresponds to a geometry of the connection point arrangement (10) and the connection points (12) of the connection point arrangement (10) are electrically connected via connections (9) to corresponding contacts (22) of the contact arrangement (20), wherein the connection points (12) of the connection point arrangement (10) are separated by way of the contacts (22) of the contact arrangement (20) and by way of conductor tracks (28) of the printed circuit board (7), wherein a first distance is specified between two adjacent first connection points (14A) of a first row (14) of the connection point arrangement (10) and between two adjacent first contacts (24A) of a first row (24) of the contact arrangement (20), and a second distance is specified between two adjacent second connection points (16A) of a second row (16) of the connection point arrangement (10) and between two adjacent second contacts (26A) of a second row (26) of the contact arrangement (20), wherein the second connection points (16A) and the second contacts (26A) of the respective second row (16, 26) are arranged offset to the first connection points (14A) and the first contacts (24A) of the respective first row (14, 24), wherein the second contacts (26A) of the second row (26) are configured to be contacted via the conductor tracks (28), which are each led through an intermediate space (B, C, D) between two adjacent contacts (24A) of the first row (24), and wherein the first distance at least between two adjacent first connection points (14A) of the first row (14) of the connection point arrangement (10) and between two corresponding adjacent first contacts (24A) of the first row (24) of the contact arrangement (20) corresponds to an intermediate space (C, D) between two contacts (22) of the contact arrangement (20), in which intermediate space at least two conductor tracks (28) having functionally reliable dimensions and distances can be arranged, said at least two conductor tracks each making contact with a second contact (26A) of the second row (26).

5. The contact-making arrangement (1) as claimed in claim 4, characterized in that the first distances between two adjacent first connection points (14A) and between two adjacent first contacts (24A) of the respective first row (14, 24) have identical values.

6. The contact-making arrangement (1) as claimed in claim 4, characterized in that the first distances between two adjacent first connection points (14A) and between two adjacent first contacts (24A) of the respective first row (14, 24) have different values.

7. The contact-making arrangement (1) as claimed in claim 6, characterized in that a first intermediate space (A) between two adjacent first contacts (24A) represents a minimum contact distance (mpa).

8. The contact-making arrangement (1) as claimed in claim 6, characterized in that only one conductor track (28) is led between two adjacent first contacts (24A) in a second intermediate space (B).

9. The contact-making arrangement (1) as claimed in claim 6, characterized in that two conductor tracks (28) are led between two adjacent first contacts (24A) in a third intermediate space (C).

10. The contact-making arrangement (1) as claimed in claim 6, characterized in that three conductor tracks (28) are led between two adjacent first contacts (24A) in a fourth intermediate space (D).

11. The contact-making arrangement (1) as claimed in claim 4, characterized in that the second distances between two adjacent second connection points (16A) and between two adjacent second contacts (26A) of the respective second row (16, 26) have identical values or different values.

12. The contact-making arrangement (1) as claimed in claim 11, characterized in that the second connection points (16A) and the second contacts (26A) of the respective second row (16, 26) are oriented symmetrically to a center of the associated intermediate space (B, C, D) between two adjacent first connection points (14A) and between two adjacent first contacts (24A) of the respective first row (14, 24).

13. The contact-making arrangement (1) as claimed in claim 4, characterized in that a wiring density (VDK) in a section of the contact arrangement (20) is calculated according to the formula VDK=kk/(mpb+4*rv+2*kü+n*mlb+(n−1)*mla), wherein kk represents a number of contacts in the section in question, mpb represents a minimum contact width, rv represents a maximum resist offset, kü represents a minimum edge covering, n represents a number of conductor tracks in the intermediate space (B, C, D) between two adjacent first contacts (26A), mlb represents a minimum conductor track width and mla represents a minimum conductor track distance.

14. The contact-making arrangement (1) as claimed in claim 13, characterized in that N is a natural number in the range of from 1 to 3.

* * * * *